(12) United States Patent
Benjamin et al.

(10) Patent No.: US 6,592,710 B1
(45) Date of Patent: Jul. 15, 2003

(54) APPARATUS FOR CONTROLLING THE VOLTAGE APPLIED TO AN ELECTROSTATIC SHIELD USED IN A PLASMA GENERATOR

(75) Inventors: Neil Benjamin, Palo Alto, CA (US); Andras Kuthi, Thousand Oaks, CA (US)

(73) Assignee: Lam Research Corporation, Fremont, CA (US)

( * ) Notice: Subject to any disclaimer, the term of this patent is extended or adjusted under 35 U.S.C. 154(b) by 83 days.

(21) Appl. No.: 09/834,523

(22) Filed: Apr. 12, 2001

(51) Int. Cl.$^7$ .......................................... H01L 21/3065
(52) U.S. Cl. ...................... 156/345.48; 118/723 AN; 118/723 I; 156/345.28; 156/345.24
(58) Field of Search ................ 118/723 I, 723 AN; 156/345.24, 345.28, 345.48

(56) References Cited

U.S. PATENT DOCUMENTS

| | | | | |
|---|---|---|---|---|
| 5,650,032 A | * | 7/1997 | Keller et al. | 156/345.48 |
| 5,735,993 A | * | 4/1998 | Yoshida | 156/345.27 |
| 5,800,688 A | | 9/1998 | Lantsman et al. | 204/298.11 |
| 6,095,159 A | * | 8/2000 | Blalock et al. | 134/1.1 |
| 6,152,071 A | * | 11/2000 | Akiyama et al. | 118/23 VE |
| 6,174,450 B1 | * | 1/2001 | Patrick et al. | 216/61 |
| 6,245,202 B1 | * | 6/2001 | Edamura et al. | 204/298.06 |
| 6,287,986 B1 | * | 9/2001 | Mihara | 438/763 |

FOREIGN PATENT DOCUMENTS

JP  10275694  * 10/1998  ............ H05H/1/46
WO  WO99/34399  12/1997  ............ H01J/37/32

OTHER PUBLICATIONS

A copy of the International Search Report International App. No. PCT/US 02/10462, mailed Aug. 21, 2002.

* cited by examiner

*Primary Examiner*—Shrive P. Beck
*Assistant Examiner*—Michelle Crowell
(74) *Attorney, Agent, or Firm*—Thelen Reid & Priest LLP; Thierry K. Lo

(57) ABSTRACT

An apparatus for controlling the voltage applied to a shield interposed between an induction coil powered by a power supply via a matching network, and the plasma it generates, comprises a shield, a first feedback circuit, and a second feedback circuit. The power supply powers the shield. The first feedback circuit is connected to the induction coil for controlling the power supply. The second feedback circuit is connected to the shield for controlling the voltage of the shield. Both first and second feedback circuits operate at different frequency ranges. The first feedback circuit further comprises a first controller and a first sensor. The first sensor sends a first signal representing the power supplied to the inductive coil to the first controller. The first controller adjusts the power supply such that the power supplied to the inductor coil is controlled by a first set point. The second feedback circuit further comprises a second sensor, a second controller, and a variable impedance network. The shield is powered via a variable impedance network. The second sensor sends a second signal representative of the voltage of the shield to the second controller. The second controller adjusts the variable impedance network such that the voltage of the shield is controlled by a second set point.

28 Claims, 6 Drawing Sheets

APPARATUS FOR CONTROLLING THE VOLTAGE APPLIED TO AN ELECTROSTATIC SHIELD USED IN A PLASMA GENERATOR

CROSS-REFERENCE TO RELATED APPLICATIONS

The present application is related to co-pending U.S. patent application Ser. No. 09/676,462, filed on Sep. 29, 2000, which is a continuation-in-part of co-pending U.S. patent application Ser. No. 09/608,883, filed on Jun. 30, 2000, which is, in turn, a continuation-in-part of co-pending Japanese Patent Application Serial No. 2000-99728, filed on Mar. 31, 2000, in Japan. These patent applications are not admitted to be prior art by the Applicant.

FIELD OF THE INVENTION

The present invention relates to a plasma processing apparatus. More particularly, the present invention relates to a method and apparatus for controlling the voltage applied to an electrostatic shield disposed between an induction coil and a plasma.

BACKGROUND OF THE INVENTION

Inductively coupled type dry etching systems are commonly used in the semiconductor manufacturing industry. The dry etching apparatus generally has a process chamber with a ceiling of a dielectric wall, on which an annular or spiral radio frequency (RF) antenna is disposed.

There are several known techniques for exciting a plasma with RF fields including capacitive coupling, inductive coupling and wave heating. In a standard inductively coupled plasma (ICP) generator, RF current passing through a coil induces electromagnetic currents in a plasma. The currents heat the conducting plasma by ohmic heating, so that it is sustained in steady state. Typically, the current through a coil acts as the primary winding of a transformer. The plasma acts as a single turn secondary winding of the transformer.

During a plasma process, the RF antenna and a plasma excited in the process chamber are coupled not only inductively but also capacitively. Consequently, the inner surface of the dielectric wall made of, e.g., quartz, which is exposed to the interior atmosphere of the process chamber near the RF antenna, is charged with a negative bias relative to the plasma. With the potential difference between the plasma and the exposed inner surface of the dielectric wall, positive ions in the plasma collide with the exposed inner surface while being accelerated. As a result, problems arise in that contaminants are produced in the process chamber and the dielectric wall is worn off quickly.

In order to cope with these problems, a conductive Faraday shield is normally disposed between a dielectric window and an insulating layer under an RF antenna. The capacitive coupling between the RF antenna and the plasma is disrupted by the Faraday shield, so that the exposed inner surface of the dielectric wall is protected from collisions with accelerated positive ions from the plasma. The Faraday shield is preferably connected to a source of RF potential to control its relative potential or bias. One option is to connect the shield to a point from the antenna in which case the shield operates at the same frequency as the coil as illustrated in FIG. 1. However, the current that is coupled out of the coil reduces the magnetic coupling with the plasma. Although such a powering scheme is simple and efficient, the controls of recipe variables are therefore limited.

An alternative powering scheme uses an external second auxiliary RF power supply separate from the main supply that powers the coil as illustrated in FIG. 2. The advantages of this scheme are the option to operate the shield at a different frequency from the antenna, the substantially smaller interaction between the shield and the coil circuit, and simplicity of control. However such extra circuitry results in higher cost and may complicate control.

Accordingly, a need exists for an apparatus and method to independently control the antenna current and the Faraday shield voltage both powered by a single power supply.

BRIEF DESCRIPTION OF THE INVENTION

An apparatus for controlling the voltage applied to a shield interposed between an induction coil powered by a power supply via a matching network, and the plasma it generates, comprises a shield, a first feedback circuit, and a second feedback circuit. The power supply powers the shield. The first feedback circuit is connected to the induction coil for controlling the power supply. The second feedback circuit is connected to the shield for controlling the voltage of the shield. Both first and second feedback circuits operate at different frequency ranges. The first feedback circuit further comprises a first controller and a first sensor. The first sensor sends a first signal representing the power supplied to the inductive coil to the first controller. The first controller adjusts the power supply such that the power supplied to the inductor coil is controlled by a first set point. The second feedback circuit further comprises a second sensor, a second controller, and a variable impedance network. The shield is powered via a variable impedance network. The second sensor sends a second signal representative of the voltage of the shield to the second controller. The second controller adjusts the variable impedance network such that the voltage of the shield is controlled by a second set point.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an apparatus and method for controlling the voltage applied to an electrostatic shield disposed between an induction coil and the plasma it is used to generate. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
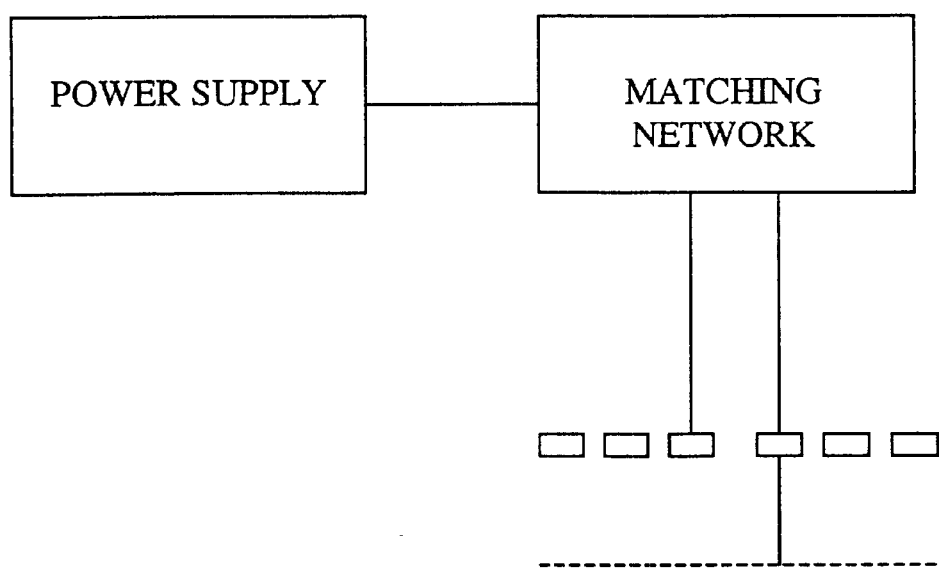
FIG. 1 is a schematic diagram illustrating an antenna and a Faraday shield powered by a single power supply according to a prior art.
Figure 2:
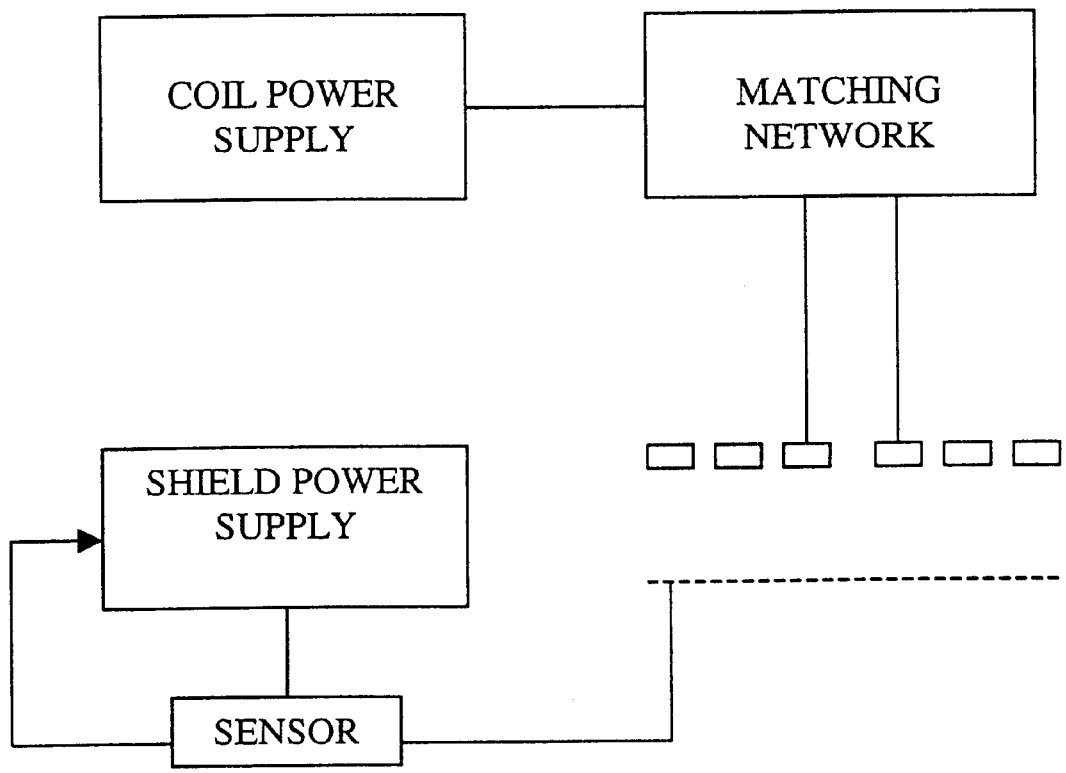
FIG. 2 is a schematic diagram of an antenna powered by a first power supply and a Faraday shield powered by a second power supply according to a prior art.
Figure 3:
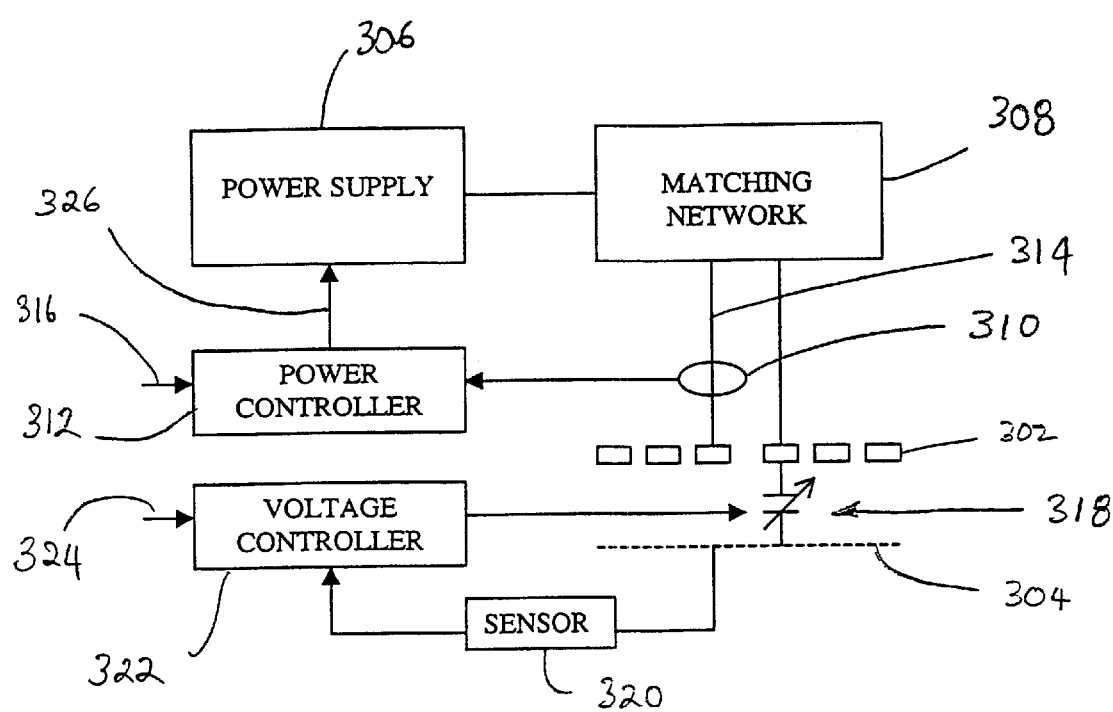
FIG. 3 is a schematic diagram illustrating an antenna and a Faraday shield both powered by a single power supply according to a specific aspect of the present invention.

FIG. 3 is a schematic diagram illustrating an antenna 302 and a Faraday shield 304 both powered by a single power supply 306 according to a specific aspect of the present invention. The power supply 306 preferably generates a radio frequency (RF) current to the antenna 302, for example in the shape of a spiral coil, via a matching network 308. A first feedback circuit comprises a sensor 310 electrically connected to a power controller 312. The sensor 310 may be any sensors capable of measuring power or current. The sensor is coupled, preferably magnetically coupled, to one of the power supply lines 314 that electrically connects the matching network 308 with the antenna 302. The power controller 314 monitors the current or power flowing into the antenna 302 and based on the signal received from the sensor 310 adjusts the power supply 306 to generate a desired current or power. This signal can be used as a feedback to compare with an external setpoint 316, and/or the matching network 308 settings, such that the current or power flowing in the antenna is held stable. Alternatively, the matching network 308 can be allowed to track the antenna variations, using a standard auto-tuning algorithm, or it can be held fixed at a fixed value, or switched to preset fixed values. Further details about the algorithms are provided below in FIG. 5.

It should be noted that the Faraday shield represents any metal plate that acts as a Faraday shield. The shield 304 is disposed between the antenna 302 and a TCP window (not shown) above a plasma chamber (not shown) and is substantially parallel to the TCP window. The shield 304 is powered by tapping energy from the antenna 302. Essentially the shield 304 is run in parallel with the antenna 302 circuit seen as a load, picking up a high voltage point at either the input or termination end of the antenna 302. The shield 304 is preferably connected via a variable impedance component or network 318, preferably a motor driven vacuum capacitor. A sensor 320, preferably a voltage sensor, is connected at the shield feed point after the series control element 318, such that the shield voltage can be measured and used a feedback control variable. Optionally, the current or power may be measured at the same sensing point. The sensor 320 measures the voltage of the shield 304 and sends a signal representative of the measured voltage to a voltage controller 322 forming another feedback circuit. The voltage controller 322 compares the voltage signal with an external setpoint 324. The outcome of the comparison generates a signal to the variable impedance component 318 to adjust the voltage of the shield 304. The algorithm of the voltage controller 322 is further described below in FIG. 6.

If the network is not accurately matched dynamically to the total load, i.e. the antenna 302 circuit and the shield 304 circuit, there will be a measure of reflected power. However, as long as the efficiency does not reduce excessively, and as long as the power supply 306 can tolerate the reflected power, the reflected power effect can be neglected.

The feedback algorithms could be achieved using analog circuitry, or more likely by imposing a digital controller into the analog electronics. As described previously, the apparatus operates two feedback loops while controlling two dependent variables simultaneously, without any priority being set. In order to ensure that the two feedback loops can operate essentially independently, it is necessary to set up a dominant pole in the response by separating the two feedback loops in the frequency domain. That is one feedback circuit may have a faster response rate while the other may have a slower response rate. It is preferable to stabilize the current in the antenna 302 on a fast time scale, for example, from 1 kHz to 1 MHz, to improve plasma stability. It is preferable to stabilize the voltage in the shield 304 on a relatively slower time scale, for example 10 Hz to 100 Hz. Otherwise, the interaction may be so strong as to keep the system in permanent chaotic oscillation.

Figure 4:
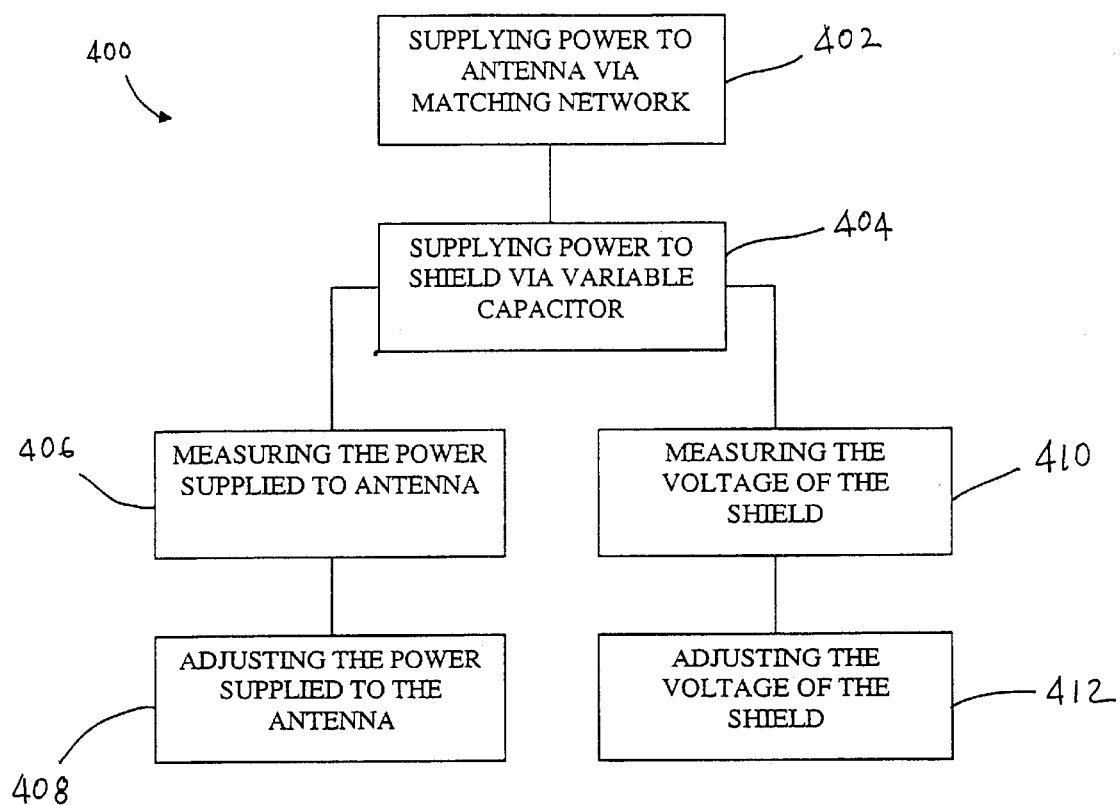
FIG. 4 is a flowchart illustrating a method to independently control the power supplied to an antenna and the voltage supplied to a shield from a single power supply according to a specific aspect of the present invention.

FIG. 4 is a flow diagram 400 illustrating a method to independently control the power supplied to the antenna 302 and the voltage supplied to the shield 304 from the single power supply 306 according to a specific aspect of the present invention. In a first block 402, the power supply 306 supplies an RF current to the antenna 302 via a matching network 308 as illustrated in FIG. 3. In block 404, the shield 304 is powered by tapping energy from the antenna 302 via a variable impedance network 318. In a block 406, the sensor 310 measures the current supplied to the antenna 302 and sends a signal to the power controller 312 representative of the power or current passing through one of the power lines 314. It should be noted that the antenna current can be monitored at the antenna input, output, a combination of both, or at some integrated distributed value as required by the losses and standing waves along the antenna. In a block 408, the power controller 312 compares the signal from the sensor 310 with an external setpoint 316 and adjusts the power supply to stabilize the current in the antenna 302. Both blocks 406 and 408 operate at a relatively fast response rate, i.e. at a higher frequency.

In a block 410, the voltage of the shield 304 is measured using a sensor 320, such as a voltage sensor, after the series control element, i.e. the variable impedance component 318. The sensor 320 sends a signal representing the voltage of the shield 304 to the voltage controller 322. In block 412, the voltage controller 412 compares the signal from the sensor 320 with an external setpoint 324 and adjusts the variable impedance component 318 to stabilize the voltage in the shield 304. Both blocks 410 and 412 operate at a relatively slow response rate, i.e. at a lower frequency.

Both blocks 406 and 408 along with blocks 410 and 412 operates simulateously but at different response rates. It should be noted that another feedback control variable that can be measured is the output power of the power supply and measured load impedance. These measurements at the output of the power supply are generally used to auto-tune or set the matching network 308 and level the delivered power to the antenna 302.

The preferred embodiment would regard the antenna 302 current or power and the shield 304 voltage as independent setpoints, and measured values of the corresponding output parameters as the primary feedback variables. Control would be implemented by adjusting the power supply setpoint 326 to stabilize the current or power of the antenna 302 and adjusting the variable impedance network 318 to stabilize the voltage of the shield 304. The matching network values can then be automatically adjusted to optimize power transfer, or at least to maintain the load seen by the power supply 306 within acceptable operating range as detected by the power supply output sensors (not shown). The desired standing wave pattern in the antenna 302 can be set by adjusting its termination impedance to the ground. It can therefore be appreciated that the present invention allows independent stable control of the current in the antenna and the voltage of the shield, even if the load varies. This is accomplished while sharing a single power supply and a matching network.

Figure 5:
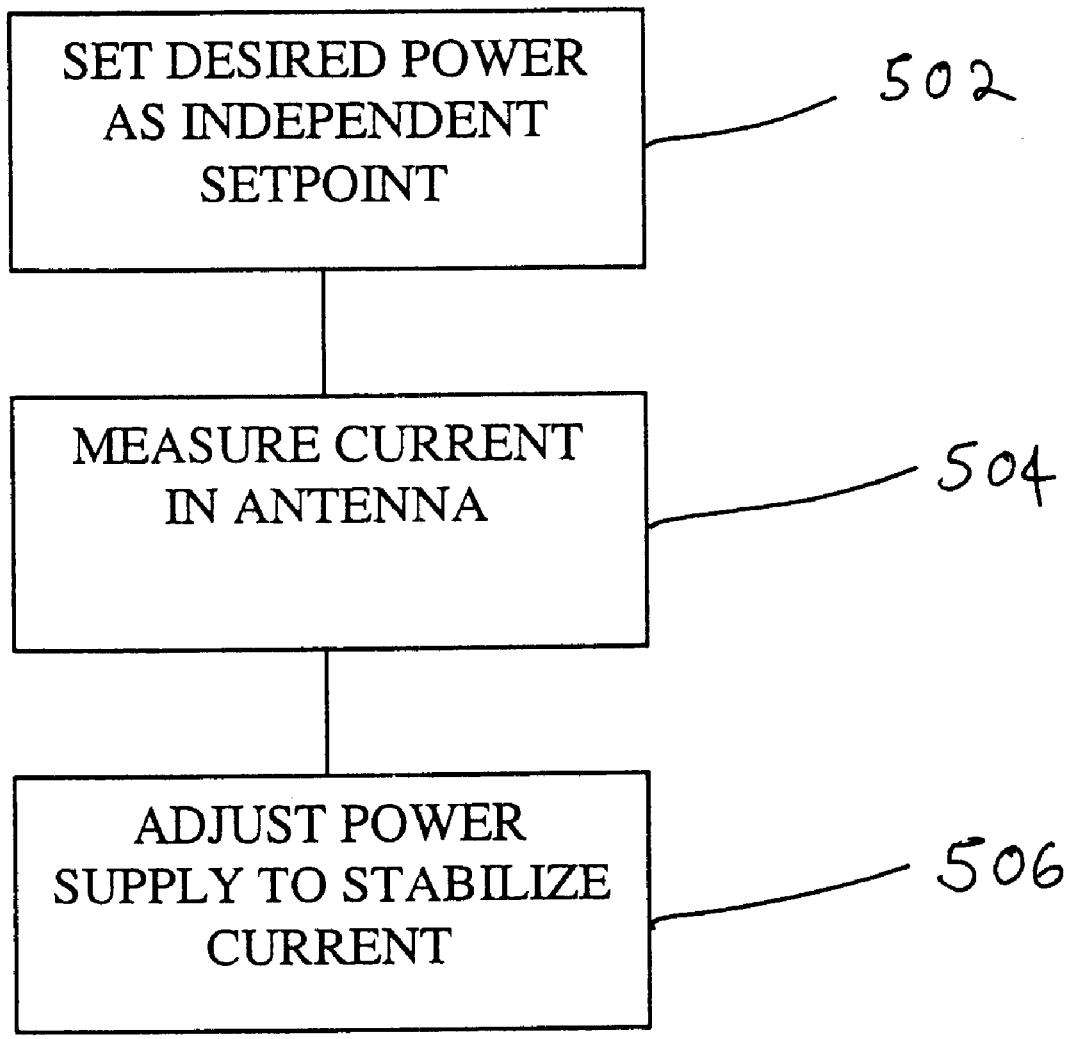
FIG. 5 is a flowchart illustrating an algorithm of a power controller according to a specific aspect of the present invention.

FIG. 5 is a flowchart illustrating an algorithm of a power controller according to a specific aspect of the present invention. In block 502, a user sets a desired power as an independent setpoint in the power controller. In block 504, the current in the antenna is measured with any suitable sensor. In block 506, the current measured is compared with the independent setpoint and the power supply is adjusted accordingly such that the power is stabilized as the desired power.

Figure 6:
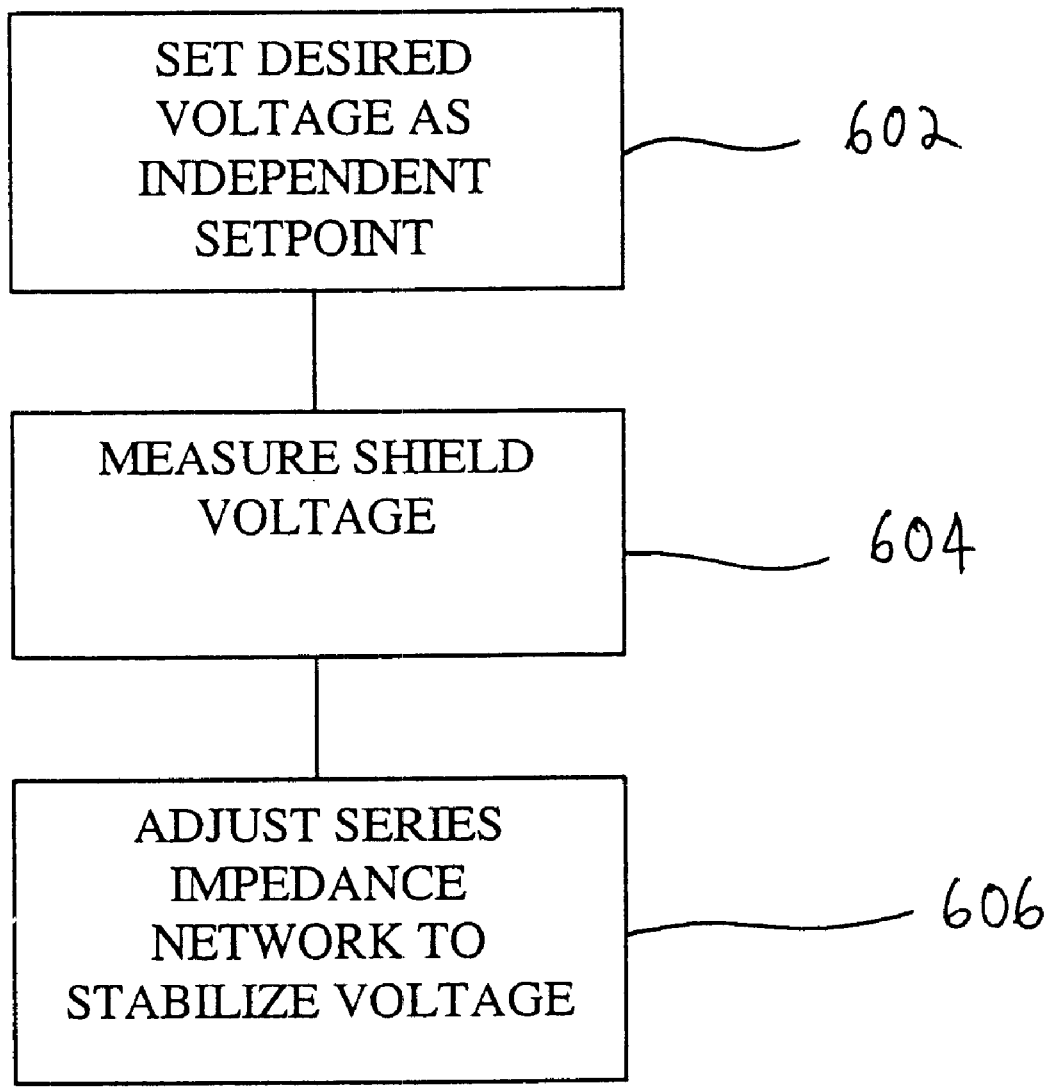
FIG. 6 is a flowchart illustrating an algorithm of a voltage controller according to a specific aspect of the present invention.

FIG. 6 is a flowchart illustrating an algorithm of a voltage controller according to a specific aspect of the present invention. In a first block 602, a user sets a desired voltage as an independent setpoint. In block 604, the shield voltage is measured with any suitable sensor. In block 606, the measured shield voltage is compared with the independent setpoint and the shield voltage is adjusted accordingly by adjusting the series impedance network to stabilize the voltage.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An apparatus for controlling the voltage applied to a shield interposed between an induction coil powered by a power supply via a matching network, and the plasma it generates, said apparatus comprising:
a shield powered by the power supply, said shield coupled to the induction coil with a variable impedance network;
a first feedback circuit connected with the induction coil for controlling the power supply; and
a second feedback circuit connected with said shield for controlling the voltage of said shield with said variable impedance network.

2. The apparatus according to claim 1 wherein said first feedback circuit and said second feedback circuit operate at different frequency ranges.

3. The apparatus according to claim 2 wherein said first feedback circuit operates at a frequency in a range of about 1 kHz to about 1 MHz.

4. The apparatus according to claim 2 wherein said second feedback circuit operates at a frequency in a range of about 10 Hz to about 100 Hz.

5. The apparatus according to claim 1 wherein said first feedback circuit further comprises a first controller and a first sensor.

6. The apparatus according to claim 5 wherein said first sensor sends a first signal representing the power supplied to the inductive coil to said first controller.

7. The apparatus according to claim 6 wherein said first controller adjusts the power supply such that the power supplied to the inductor coil is controlled by a first set point.

8. The apparatus according to claim 1 wherein said second feedback circuit further comprises a second sensor, a second controller, and said variable impedance network.

9. The apparatus according to claim 8 wherein said shield is powered via said variable impedance network.

10. The apparatus according to claim 9 wherein said variable impedance network further comprises a variable capacitor.

11. The apparatus according to claim 10 wherein said second sensor sends a second signal representative of the voltage of said shield to said second controller.

12. The apparatus according to claim 11 wherein said second controller adjusts said variable impedance network such that the voltage of said shield is controlled by a second set point.

13. An apparatus for controlling the voltage applied to a shield interposed between an induction coil powered by a power supply through a matching network and a plasma it generates, the apparatus comprising:
a variable impedance network coupled to the induction coil;
a shield coupled to said variable impedance network, said shield powered by the power supply;
a first sensor connected with said shield for measuring the voltage of said shield, said first sensor sending a first signal representative of the measured voltage; and
a first controller connected with said sensor for receiving said first signal, said controller adjusting said variable impedance network such that said first signal is close to a first specified set point;
a second sensor connected with the induction coil for measuring power flowing in the induction coil, said second sensor sending a second signal representative of the measured power; and
a second controller connected with said second sensor for receiving said second signal, said second controller adjusting the power supply such that said second signal is close to a second specified set point.

14. The apparatus according to claim 13 wherein said variable impedance network further comprises a variable vacuum capacitor.

15. The apparatus according to claim 13 wherein said first controller operates at a frequency in a range of about 1 kHz to about 1 MHz.

16. The apparatus according to claim 13 wherein said second controller operates at a frequency in a range of about 10 Hz to about 100 Hz.

17. An apparatus for controlling the voltage applied to a shield interposed between an induction coil powered by a power supply via a matching network, and the plasma it generates, said apparatus comprising:

means for powering the shield, wherein a variable impedance network couples the shield to the induction coil;

means for adjusting the power supply based on a first feedback circuit; and means for adjusting the voltage of the shield based on a second feedback circuit.

18. The apparatus according to claim 17 wherein said first feedback circuit and said second feedback circuit operate at different frequency ranges.

19. The apparatus according to claim 18 wherein said first feedback circuit operates at a frequency in a range of about 1 kHz to about 1 MHz.

20. The apparatus according to claim 18 wherein said second feedback circuit operates at a frequency in a range of about 10 Hz to about 100 Hz.

21. The apparatus according to claim 17 wherein said first feedback circuit further comprises a first controller and a first sensor.

22. The apparatus according to claim 21 wherein said first sensor sends a first signal representing the power supplied to the inductive coil to said first controller.

23. The apparatus according to claim 22 wherein said first controller adjusts the power supply such that the power supplied to the inductor coil is controlled by a first set point.

24. The apparatus according to claim 17 wherein said second feedback circuit further comprises a second sensor, a second controller, and said variable impedance network.

25. The apparatus according to claim 24 wherein said shield is powered via said variable impedance network.

26. The apparatus according to claim 25 wherein said variable impedance network further comprises a variable capacitor.

27. The apparatus according to claim 24 wherein said second sensor sends a second signal representative of the voltage of said shield to said second controller.

28. The apparatus according to claim 24 wherein said second controller adjusts said variable impedance network such that the voltage of said shield is controlled by a second set point.

* * * * *

UNITED STATES PATENT AND TRADEMARK OFFICE
CERTIFICATE OF CORRECTION

PATENT NO. : 6,592,710 B1
DATED : July 15, 2003
INVENTOR(S) : Neil Benjamin and Andras Kuthi It is certified that error appears in the above-identified patent and that said Letters Patent is hereby corrected as shown below:

Column 5,
Line 62, replace "said shield coupled to the induction coil with a variable impedance network" with -- via a variable impedance network arranged between the shield and the induction coil --.

Column 7,
Line 5, after "shield" insert -- via a variable impedance network --.
Line 6, replace "couples the shield to the induction coil" with -- arranged between the shield and the induction coil --.

Signed and Sealed this

Fourth Day of May, 2004

JON W. DUDAS
*Acting Director of the United States Patent and Trademark Office*